(12) United States Patent
Choi et al.

(10) Patent No.: US 9,448,292 B2
(45) Date of Patent: Sep. 20, 2016

(54) CRYOPROBE USING CLOSED GAS LOOP FOR NUCLEAR MAGNETIC RESONANCE APPARATUS

(71) Applicant: KOREA BASIC SCIENCE INSTITUTE, Daejeon (KR)

(72) Inventors: Yeon Suk Choi, Daejeon (KR); Seung Young Park, Daejeon (KR); Sang Gap Lee, Daejeon (KR)

(73) Assignee: KOREA BASIC SCIENCE INSTITUTE, Deajeon (KR)

( * ) Notice: Subject to any disclaimer, the term of this patent is extended or adjusted under 35 U.S.C. 154(b) by 529 days.

(21) Appl. No.: 14/107,164

(22) Filed: Dec. 16, 2013

(65) Prior Publication Data

US 2015/0111751 A1 Apr. 23, 2015

(30) Foreign Application Priority Data

Oct. 17, 2013 (KR) ........................ 10-2013-0123725

(51) Int. Cl.
*G01R 33/34* (2006.01)
*G01R 33/30* (2006.01)
*G01R 33/31* (2006.01)

(52) U.S. Cl.
CPC ......... *G01R 33/3403* (2013.01); *G01R 33/307* (2013.01); *G01R 33/31* (2013.01)

(58) Field of Classification Search
CPC ... G01R 33/403; G01R 33/307; G01R 33/31
See application file for complete search history.

(56) References Cited

U.S. PATENT DOCUMENTS

| 2,960,649 | A | * | 11/1960 | Bloch | G01N 24/00 324/310 |
| 4,247,820 | A | * | 1/1981 | Keller | G01R 33/307 324/321 |
| 4,254,373 | A | * | 3/1981 | Lippmaa | G01R 33/31 324/321 |
| 4,587,492 | A | * | 5/1986 | Laudermilch | G01R 33/31 324/318 |
| 2014/0055138 | A1 | * | 2/2014 | Takegoshi | G01R 33/31 324/322 |
| 2014/0055139 | A1 | * | 2/2014 | Takegoshi | G01R 33/30 324/322 |

FOREIGN PATENT DOCUMENTS

KR 10-0657399 B1 12/2006
KR 10-1038562 B1 6/2011

* cited by examiner

*Primary Examiner* — G. M. Hyder (57) ABSTRACT

Provided is a cryoprobe using a closed gas loop for a nuclear magnetic resonance apparatus, including: superconducting magnets providing a magnetic field; a rotor rotatably disposed between the superconducting magnets in the state of a sample being put therein, the rotor being rotated by a driving gas; a coil configured to generate a nuclear magnetic resonance spectrum according to a resonance phenomenon of the sample by applying a radio frequency to the rotor; and a gas loop configured to cool the driving gas in a cryogenic condition while circulating it in a closed-loop condition and to supply the driving gas to the rotor, wherein the gas loop supplies the driving gas to the rotor while cooling it in a cryogenic condition, thereby rotating the rotor.

9 Claims, 7 Drawing Sheets

CRYOPROBE USING CLOSED GAS LOOP FOR NUCLEAR MAGNETIC RESONANCE APPARATUS

CROSS REFERENCE RELATED APPLICATION

This application claims foreign priority of Korean Patent Application No. 10-2013-0123725, filed on Oct. 17, 2013, which is incorporated by reference in its entirety into this application.

BACKGROUND OF THE INVENTION

1. Field of the Invention

The present invention relates, in general, to a probe for a nuclear magnetic resonance apparatus, and, more particularly, to a cryoprobe using a closed gas loop for a nuclear magnetic resonance apparatus, which can reduce thermal noise and improve sensitivity by rotating a rotor in which a sample is put in a cryogenic condition.

2. Description of the Related Art

Generally, when nuclear spin of an atom, which constitutes all substances, exists under an external magnetic field, the nuclear spin carries out precession around the external magnetic field. In this case, when a specific radio frequency (RF) proportional to the external magnetic field is applied from the outside, a resonance phenomenon is observed. This is called nuclear magnetic resonance (NMR).

A nuclear magnetic resonance (NMR) apparatus is used in analyzing a molecular structure and components of various substances including inorganic substances, polymers, organic substances and the like using the resonance phenomenon possessed by an atomic nucleus and is widely used in various fields, such as biology, chemistry, physics, pharmacology and the like.

Figure 1:
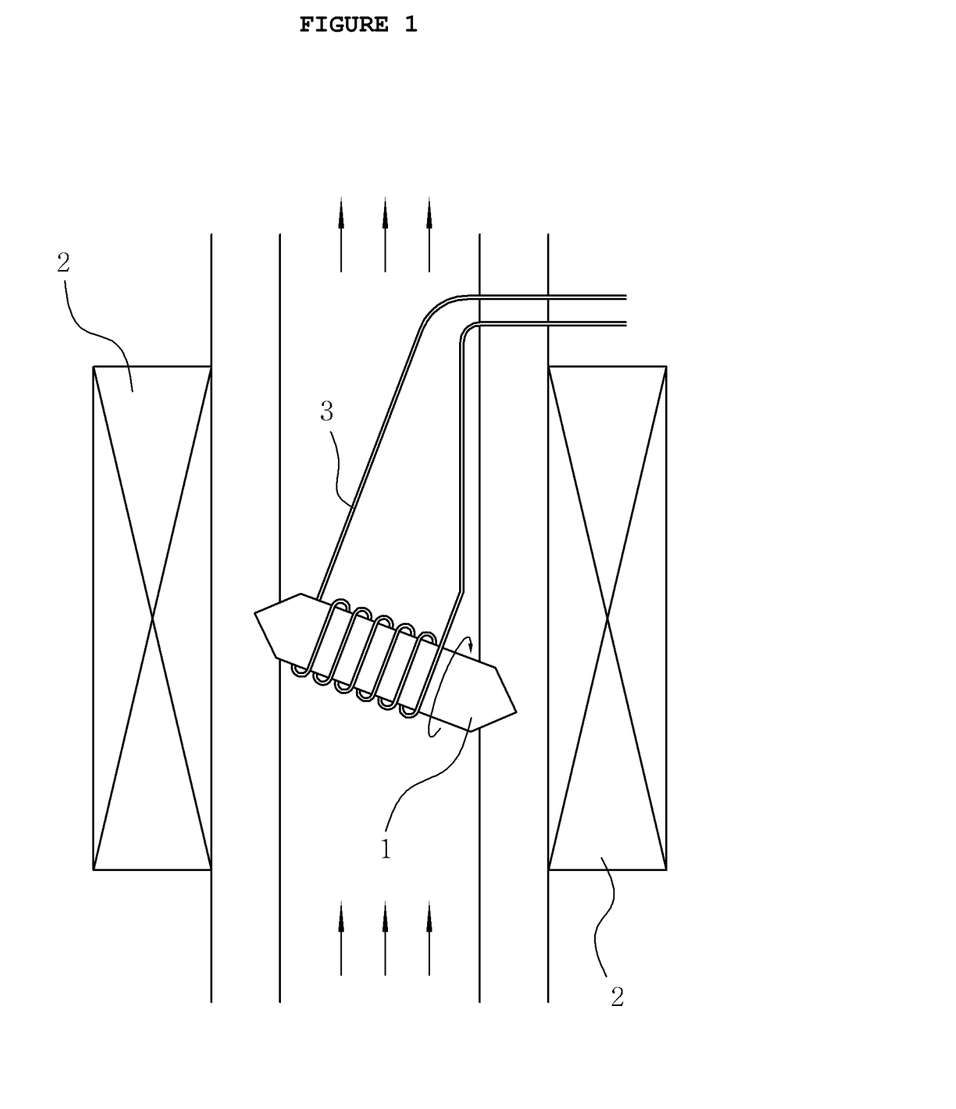
FIG. 1 is a schematic diagram showing a general probe for a nuclear magnetic resonance apparatus.

As illustrated in FIG. 1, the general probe for the nuclear magnetic resonance apparatus is configured such that a rotor 1 in which a sample providing a magnetic field is placed is rotatably installed between magnets 2 providing a magnetic field, and a coil 3 providing an RF electromagnetic pulse is formed in a form of being wound around the rotor 1.

The general probe for the nuclear magnetic resonance apparatus senses a resonance phenomenon generated by the RF electromagnetic pulse of the coil 3 while rotating the rotor 1 with high pressure air, thereby detecting a magnetic resonance spectrum according to the sample. Thus, a user analyzes the sample through the magnetic resonance spectrum showing different detection peaks according to components of the sample.

However, the general probe is problematic in that detection sensitivity is deteriorated because thermal noise occurs when the rotor 1 is rotated, and thus a detection peak of the magnetic resonance spectrum becomes smoothed out.

Recently, in order to reduce the thermal noise and increase a signal to noise ratio (S/N), a nuclear magnetic resonance apparatus gas has been used, in which the rotor 1 is rotated while being cooled using nitrogen gas or helium gas.

However, in the conventional probe for the nuclear magnetic resonance apparatus, since high-priced nitrogen gas or helium gas used as a cooling gas is not recovered, but is discharged and is then dumped, it is problematic in that the operation cost is high. In addition to this, it is problematic in that the discharged cooling gas is discharged to the atmosphere, thereby having a bad effect on the environment.

Also, the conventional probe is problematic in that noise and vibration seriously occur because a mechanical compressor is used in order to supply the cooling gas to the rotor 1.

The foregoing is intended merely to aid in the understanding of the background of the present invention, and is not intended to mean that the present invention falls within the purview of the related art that is already known to those skilled in the art.

SUMMARY

Accordingly, the present invention has been made keeping in mind the above problems occurring in the related art, and an object of the present invention is to provide a cryoprobe using a closed gas loop for a nuclear magnetic resonance apparatus, which can cool a rotor while rotating it using cooling gas, and which is not needed to recharge a cooling fluid by circulating the used cooling gas in a closed-loop condition and resupplying it in a cooling state.

Another object of the present invention is to provide a cryoprobe using a closed gas loop for a nuclear magnetic resonance apparatus which can control noise and vibration resulting from the pressure of cooling gas while circulating the cooling gas.

Still another object of the present invention is to provide a cryoprobe using a closed gas loop for a nuclear magnetic resonance apparatus which can preliminarily cool cooling gas by recycling a fluid for refining the cooling gas.

In order to achieve the above objects, according to an aspect of the present invention, a cryoprobe using a closed gas loop for a nuclear magnetic resonance apparatus may include: superconducting magnets providing a magnetic field; a rotor rotatably disposed between the superconducting magnets in the state of a sample being put therein, the rotor being rotated by a driving gas; a coil configured to generate a nuclear magnetic resonance spectrum according to a resonance phenomenon of the sample by applying a radio frequency to the rotor; and a gas loop configured to cool the driving gas in a cryogenic condition while circulating it in a closed-loop condition and to supply the driving gas to the rotor, wherein the gas loop includes: a reserve tank connected to one side of the rotor and configured to introduce the driving gas which rotates the rotor and to absorb pressure while storing the driving gas; a refiner configured to refine impurities included in the driving gas by condensing the impurities while cooling the driving gas discharged from the reserve tank with a cooling fluid and allowing the driving gas to flow through the cooling fluid; a storage tank configured to store and discharge the driving gas refined in the refiner in a predetermined capacity; a heat exchanger configured to cool the driving gas to a cryogenic condition by performing heat-exchanging between the driving gas discharged from the reserve tank and a refrigerant and to supply the cooled driving gas to the other side of the rotor; and a refrigerant cooler configured to cool the refrigerant that has been heat-exchanged with the driving gas while circulating the refrigerant to the heat exchanger.

Also, the gas loop may further include: a cold heater disposed at the front or rear of the reserve tank and configured to heat the driving gas at room temperature; a regulator connected to the cold heater via the refiner and the storage tank and configured to regulate pressure of the driving gas heated at the room temperature to a predetermined pressure; and a flow controller configured to provide the driving gas supplied from the regulator to the heat exchanger in a predetermined flow rate.

In addition to this, the gas loop may further include at least one high pressure converter configured to convert the driving gas discharged from the reserve tank into high pressure and to supply it.

The high pressure converter may include, for example, an expansion chamber configured to provide an expansion space of the driving gas while storing the driving gas discharged from the reserve tank; an expansion heater configured to expand the driving gas inside the expansion chamber by heating the expansion chamber and to convert the driving gas into high pressure; a discharge valve openably provided at an outlet of the expansion chamber to close the outlet and configured to discharge the high pressure driving gas while being opened by the driving gas of the expansion chamber being expanded at the high pressure; and an inlet valve openably provided at an inlet of the expansion chamber and for allowing the driving gas of the reserve tank to flow into the expansion chamber while being opened by the high pressure driving gas being discharged to the discharge valve.

Unlike this, the high pressure converter may be composed of a high-pressure centrifugal converter configured to compress the driving gas at high pressure while providing a centrifugal force by rotating the driving gas discharged from the reserve tank.

Also, the high pressure converter may be configured in a plural number and may be continuously installed in series or in parallel, thereby continuously compressing the driving gas.

Furthermore, the gas loop may further include a preliminary heat exchanger configured to preliminarily cool the driving gas supplied to the heat exchanger while performing heat-exchanging between the driving gas and a cooling fluid of the refiner.

The preliminary heat exchanger may be composed of, for example, a fluid extension line connected to the refiner so as to extend the cooling fluid used in the refiner and to allow the driving gas and the cooling fluid to flow in an adjacent state before the driving gas is supplied to the heat exchanger.

Furthermore, the driving gas may be composed of at least one of nitrogen gas and helium gas.

As set forth above, according to the cryoprobe using the closed gas loop for a nuclear magnetic resonance apparatus, since the rotor in which the sample is put is rotated by the driving gas in a cooling state, thermal noise is reduced, thereby improving detection sensitivity. In particular, as the used driving gas is resupplied in a cooling state while being circulated by the gas loop, there is no need to recharge the driving gas, and accordingly, cost can be reduced, and environmental pollution due to discharge of the cooling gas can be also prevented.

Also, since the refiner which constitutes the gas loop removes the impurities such as water included in the driving gas, the driving gas is supplied to the rotor in a pure state, thereby enabling the rotor to be stably rotated.

Also, since the driving gas is regulated to room temperature and uniform pressure by the cold heater and the regulator, when the low temperature control of the driving gas cannot be performed, it is possible to perform flow control by the flow controller.

Furthermore, since the expansion chamber which constitutes the high pressure converter discharges the driving gas in a state of being expanded by high pressure due to heating of the expansion heater, the driving gas can be pressurized with a reduction in noise and vibration.

In addition to this, when the high pressure converter is configured in a plural number and thus is continuously installed, continuous high pressure conversion of the driving gas may be achieved, thereby leading to an improvement in the compression ratio of the driving.

Moreover, since the driving gas is preliminarily cooled by a preliminary heat exchanger before the driving gas is supplied to the heat exchanger, the driving gas can be easily and efficiently cooled in a cryogenic condition.

Specifically, since the fluid extension line which constitutes the preliminary cooler preliminarily cools the driving gas through the cooling fluid used in the refiner, a cooling effect of the driving gas can be maximized and an energy reduction effect resulting from reuse of the cooling fluid can be expected.

BRIEF DESCRIPTION

The above and other objects, features and other advantages of the present invention will be more clearly understood from the following detailed description when taken in conjunction with the accompanying drawings, in which.

DETAILED DESCRIPTION

Hereinbelow, preferred embodiments of the present invention will be described in detail with reference to the accompanying drawings. In describing the present invention, the detailed description regarding a publicly known universal function or configuration related to the present invention will be omitted.

Figure 2:
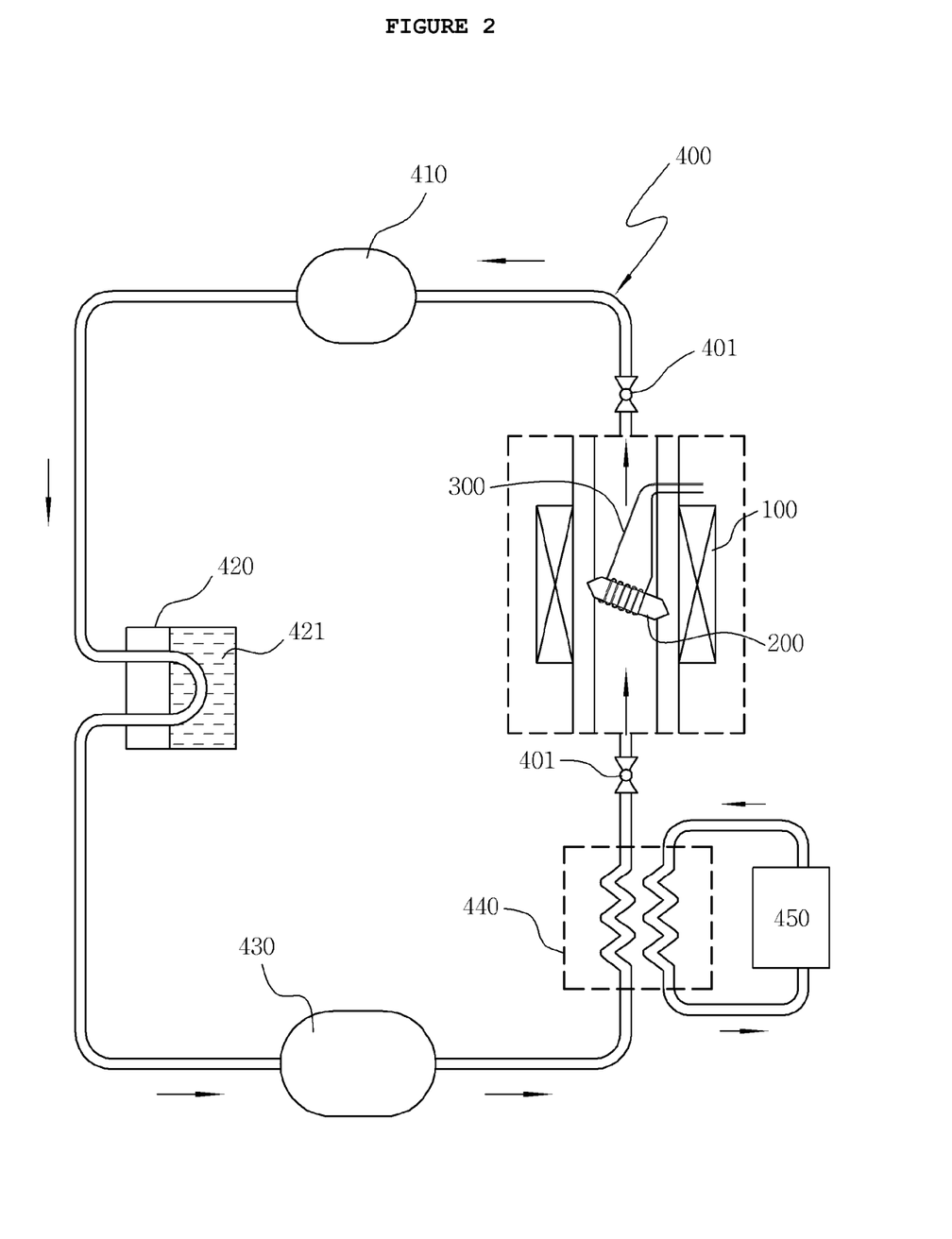
FIG. 2 is a conceptual view showing a probe for a nuclear magnetic resonance apparatus according to an embodiment of the present invention.

A cryoprobe using a closed gas loop for a nuclear magnetic resonance apparatus according to an embodiment of the present invention includes, as illustrated in FIG. 2, superconducting magnets 100, a rotor 200, a coil 300 and a gas loop 400.

The superconducting magnets 100 are a member which forms a magnet field.

The rotor 200 is a constitutive element that is rotatably installed between the superconducting magnets 100 as illustrated in FIG. 2 and is rotated by a driving gas which will be described later. The rotor 200 is configured in a tube form as illustrated in the drawing and is rotated in a state of a solid sample or a liquid sample being put therein.

For example, the rotor 200 may be cooled while being rotated by the driving gas supplied in an axis direction at a high speed, and as bearing gas is supplied to both ends thereof, the rotor 200 may be easily and efficiently rotated in a state of levitation.

The coil 300 is installed in a state of being wound around the rotor 200 as illustrated in FIG. 2 and provides a nuclear magnetic resonance spectrum resulting from a resonance phenomenon of the sample by applying a radio frequency.

Specifically, when the sample is rotated in a magnetic field due to the superconducting magnets 100 and a radio frequency is applied by the coil 300, an energy state change resulting from an excited state of an atomic nucleus in the sample occurs. The nucleus enters into an excited state by absorbing energy and then releases the absorbed energy, thereby emitting weak electromagnetic radiation while returning to an original ground state. Information on a physical and chemical state around the nucleus is included in the electromagnetic radiation. By adopting the information minutely, Fourier transform is carried out, and thus after obtaining the nuclear magnetic resonance spectrum, information regarding each peak of the spectrum is obtained.

Meanwhile, the configurations of the superconducting magnets 100, the rotor 200 and the coil 300 described above may adopt configurations known in the field to which the present invention pertain.

The gas loop 400 is an element configured to rotate the rotor 200 in a cooling state by supplying the driving gas to the rotor 200 in a cryogenic condition and to resupply the used driving gas to the rotor 200 by re-cooling the driving gas in the cryogenic condition while circulating it in a closed-loop state. The gas loop 400 may include, for example, as illustrated in FIG. 2, a reserve tank 410, a refiner 420, a storage tank 430, a heat exchanger 440 and a refrigerant cooler 450.

Here, it is preferable that the driving gas be composed of helium gas or nitrogen gas in order to cool the sample being put in the gas loop 400 at a very low temperature.

The reserve tank 410 is a member for absorbing pressure of the driving gas which rotates the rotor 200, and as illustrated in FIG. 2, the reserve tank is connected to one side of the rotor 200 to absorb the pressure as the driving gas of high pressure is introduced and is temporarily stored in the reserve tank.

The refiner 420 is an element configured to refine the driving gas by removing impurities such as water included in the driving gas. For example, the refiner 420 is configured in a cooling trap form as illustrated in FIG. 2 and condenses the impurities included in the driving gas while allowing a part of the driving gas in a cooling state to flow through a cooling fluid 421.

Here, it is preferable that the cooling fluid 421 be composed of liquid nitrogen.

That is, the refiner 420 refines the driving gas by condensing impurities such as water having a higher condensation point than that of the cooling fluid 421 while allowing the part of the driving gas to flow in a state of being cooled by the cooling fluid 421 as illustrated in FIG. 2. Furthermore, the refiner 420 may collect the condensed impurities by being provided with a collecting chamber which is not illustrated in the drawing, and may discharge the condensed impurities to the outside.

The storage tank 430 communicates with the refiner 420 as illustrated in FIG. 2 and stores the driving gas discharged from the refiner 420 in a predetermined capacity, thereby discharging it to the heat exchanger 440 which will be described later. When low temperature control of the driving gas can be performed, the storage tank 430 is independently installed so as to discharge the driving gas in a predetermined capacity. Unlike this, when the low temperature control of the driving gas cannot be performed, the storage tank 430 may be installed with a cold heater 460, a regulator 470 and a flow controller 480 which will be described later.

Meanwhile, the aforesaid refiner 420 may be disposed at the rear of the storage tank 430 differently from that illustrated in the drawing. This is because the condensation point increases when the pressure of the driving gas is high, and thus it is appropriate for the maintenance of purity of the driving gas to refine of the high pressure driving gas.

The heat exchanger 440 is a member for cooling the driving gas in a cryogenic temperature condition, performs heat-exchanging between the driving gas discharged from the storage tank 430, as illustrated in FIG. 2, and a refrigerant flowing in a counter flow state, and supplies the driving gas cooled at a cryogenic temperature to the other side of the rotor 200.

Here, a control valve 401 is provided at an inlet side and an outlet side of the rotor 200, respectively, as illustrated in FIG. 2, so as to control inflow and discharge of the driving gas.

The refrigerant cooler 450 circulates the refrigerant to the heat exchanger, as illustrated in FIG. 2, and cools the refrigerant that has been heat-exchanged with the driving gas.

Figure 3:
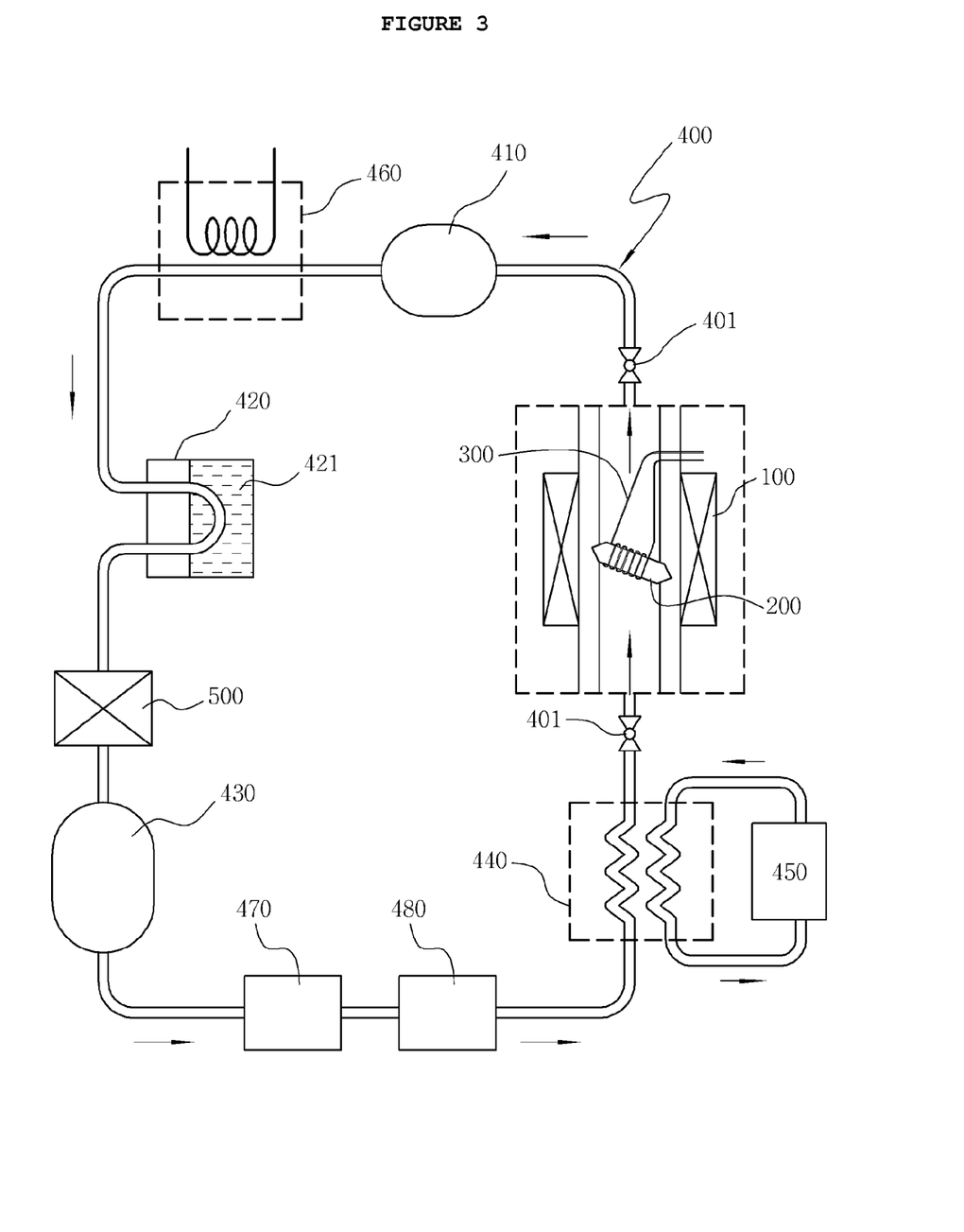
FIG. 3 is a schematic diagram showing an embodiment of a gas loop illustrated in FIG. 2.

Meanwhile, the gas loop 400 of the present invention may further include the cold heater 460, the regulator 470 and the flow controller 480 as illustrated in FIG. 3.

The cold heater 460 is installed at the rear of the aforesaid reserve tank 410 as illustrated in FIG. 3 or is installed at the front of the reserve tank 410 to heat the driving gas at room temperature. It is preferable that the cold heater 460 heat the driving gas at 15~20° C.

The regulator 470 is a member configured to regulate the pressure of the driving gas in a certain state. It is preferable that the regulator 470 be installed at the rear of the refiner 420 and the storage tank 430 as illustrated in FIG. 3, and the regulator 470 regulates the pressure of the driving gas discharged from the storage tank 430 in a predetermined pressure.

The flow controller 480 is connected to the regulator 470, as illustrated in FIG. 3, and supplies the driving gas to the heat exchanger 440 in a predetermined flow rate, in which the driving gas is supplied in a uniform pressure and room temperature state.

As previously described, the cold heater 460, the regulator 470 and the flow controller 480 are installed when it is impossible to control a flow rate of the driving gas at a low temperature, and the installation of them may be omitted when it is possible to perform low temperature control of the driving gas.

Meanwhile, the gas loop 400 of the present invention may further include a high pressure converter 500 as illustrated in FIG. 3.

The high pressure converter 500 is an element configured to convert the driving gas into high pressure to supply the driving gas. The high pressure converter 500 may be composed of, for example, a centrifugal compressor which compresses the driving gas at high pressure while providing a centrifugal force by rotating the driving gas discharged from the reserve tank 410. That is, the pressure converter 500 is composed of a mechanical compressor so as to supply the driving gas compressed at the high pressure to the storage tank 430.

Figure 4:
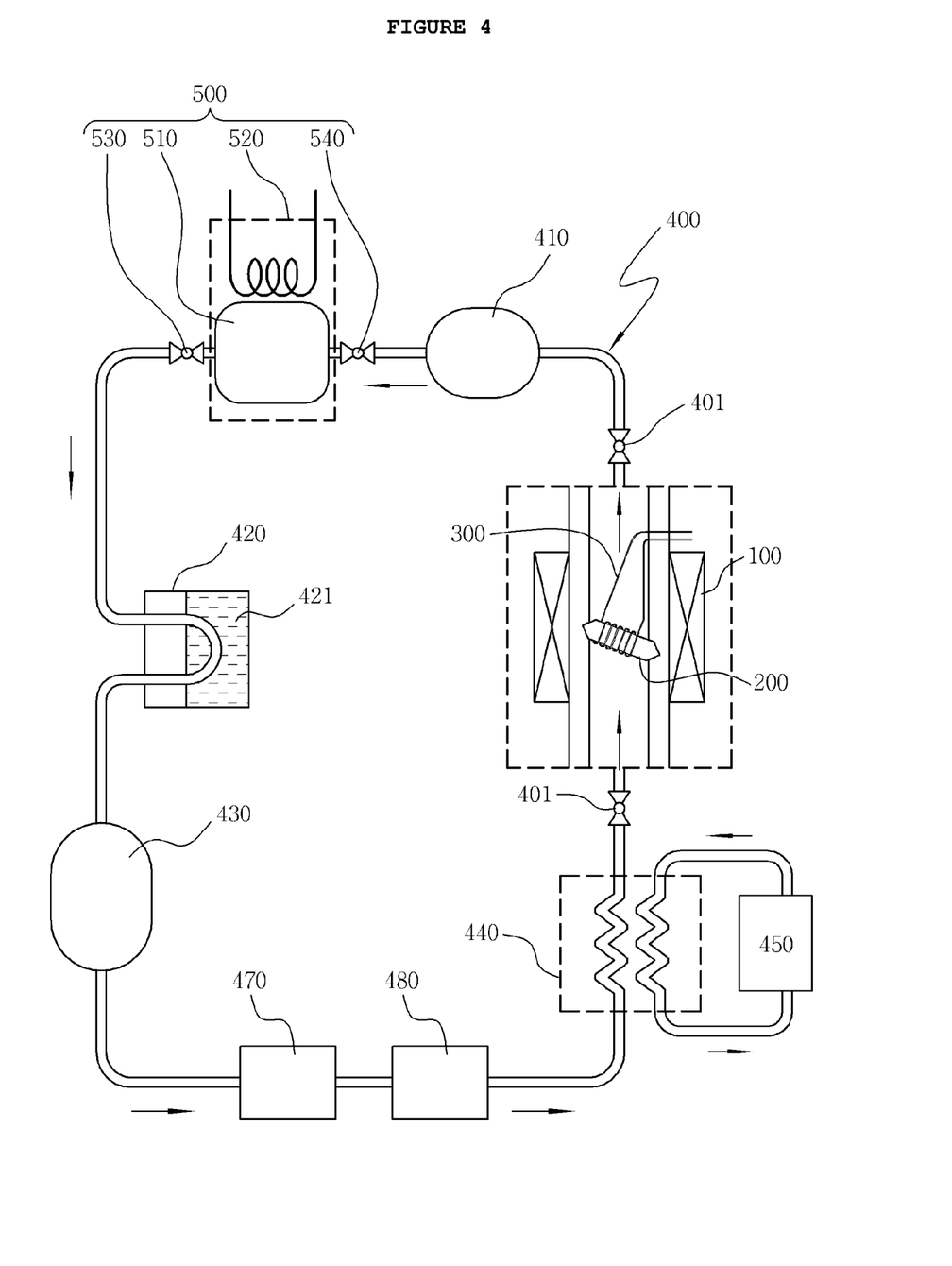
FIG. 4 is a schematic diagram showing an embodiment of a high pressure converter illustrated in FIG. 3.

Unlike this, the high pressure converter 500 may include, for example, as illustrated in FIG. 4, an expansion chamber 510, an expansion heater 520, a discharge valve 530 and an inlet valve 540.

The expansion chamber 510 is an element configured to provide an expansion space for the driving gas. As illustrated in FIG. 4, the expansion chamber 510 may be installed between the reserve tank 410 and the refiner 420 and may store the driving gas discharged from the reserve tank 410 in a predetermined capacity.

As illustrated in FIG. 4, the expansion heater 520 is installed adjacent to the expansion chamber 510 to heat the expansion chamber at a high temperature. That is, as the driving gas is heated by the expansion heater 520 in an inner part of the expansion chamber 510, while the driving gas expands, the pressure thereof is increased.

The discharge valve 530 is openably provided at an outlet of the expansion chamber 510 as illustrated in FIG. 4 and is configured to control discharge of the driving gas. Here, it is preferable that the discharge valve 530 be composed of a check valve which allows the fluid to flow only in one direction. The discharge valve 530 closes the outlet as the driving gas is introduced into the expansion chamber 510, and opens the outlet as the driving gas of the expansion chamber 510 expands at high pressure, thereby supplying the driving gas of the high pressure to the refiner 420.

The inlet valve 540 is openably installed at the inlet of the expansion chamber 510 as illustrated in FIG. 4, thereby controlling inflow of the driving gas. For example, it is preferable that the inlet valve 540 be composed of a check valve which allows the fluid to flow only in one direction. The inlet valve 540 allows inflow of the driving gas while being opened by negative pressure generated in the inner portion of the expansion chamber 510 as the discharge valve 530 discharges the expanded driving gas, and is closed after the inflow of the driving gas.

That is, the discharge valve 530 is opened by the high pressure of the expansion chamber 510 resulting from expansion of the driving gas, thereby discharging the driving gas, and the inlet valve 540 is opened by the negative pressure of the expansion chamber 410 resulting from discharge of the driving gas, thereby allowing inflow of the driving gas.

As such, when the high pressure converter 500 is composed of the expansion chamber 510, the expansion heater 520, the discharge valve 530 and the inlet valve 540, noise and vibration of the centrifugal compressor which is a mechanical compressor can be remarkably reduced.

Figure 5A:
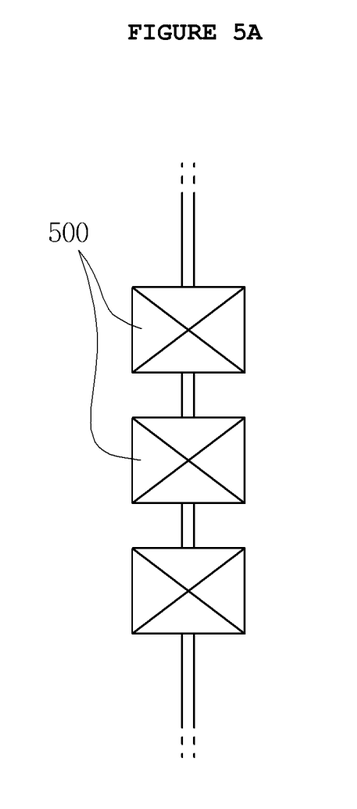
FIGS. 5A and 5B are views showing different arrangements of the high pressure converter illustrated in FIG. 3.
Figure 5B:
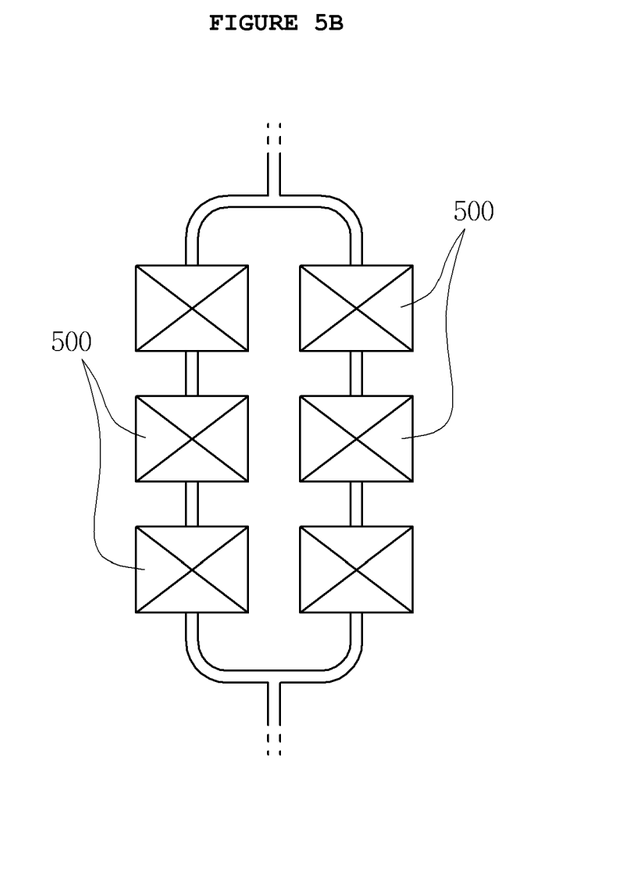

Here, the high pressure converter 500 may be configured in a plural number in series as illustrated in FIG. 5A or may be continuously installed in parallel as illustrated in FIG. 5B. As such, when the high pressure converter 500 is continuously installed, a compression ratio of the driving gas may be improved by continuously compressing the driving gas.

Figure 6:
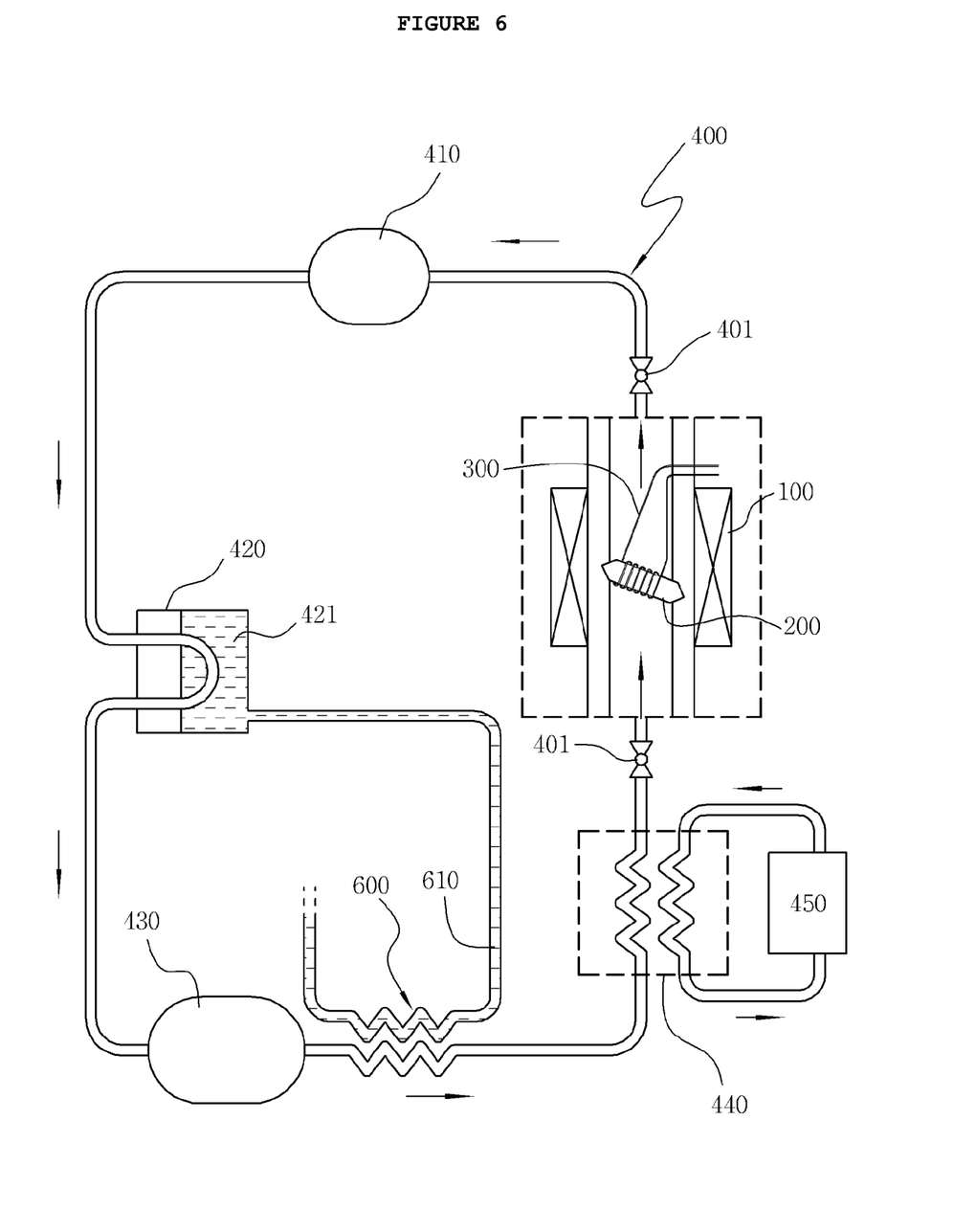
FIG. 6 is a schematic diagram showing another embodiment of the gas loop illustrated in FIG. 2.

Meanwhile, the gas loop 400 of the present invention may further include a preliminary heat exchanger 600, as illustrated in FIG. 6.

The preliminary heat exchanger 600 is an element configured to preliminarily cool the driving gas by performing heat-exchanging between the driving gas and the cooling fluid of the refiner 420 before the driving gas flows to the aforesaid heat exchanger 440. The preliminary heat exchanger 600 may be composed of, for example, a fluid extension line 610 as illustrated in FIG. 6.

The fluid extension line 610 is connected to the refiner 420 as illustrated in the drawing, extends the cooling fluid 421 used in the refiner 420 to the front of the heat exchanger 440, and performs heat-exchanging between the driving gas and the cooling fluid 421 while allowing the driving gas and the cooling fluid 421 to flow in an adjacent state before the driving gas flows to the heat exchanger 440. The fluid extension line 610 may again cool the cooling fluid 421 that has been heat-exchanged with the driving gas prior to resupplying the cooling fluid to the refiner 420. Unlike this, the fluid extension line 610 may discard the cooling fluid 421.

The operation and effect of the cryoprobe using the closed gas loop for the nuclear magnetic resonance apparatus according to present invention including the constitutive elements as described above will be hereinafter described.

Referring to FIG. 2, when the low temperature control of the driving gas can be performed, the driving gas is supplied to the rotor 200, absorbs pressure while being introduced into the reserve tank 410 after rotating the rotor 200 in a cooling state, and is supplied to the refiner 420 so that impurities can be refined. At this time, the impurities such as water agglomerate and are collected or are discharged to the outside as the driving gas flows in a cooling state due to the cooling fluid. Furthermore, the driving gas is stored in the storage tank 430 in a state of being compressed by the high pressure converter 500 and is resupplied to the rotor 200 after being cooled by the heat exchanger 440 to a cryogenic temperature.

Referring to FIG. 3, when it is impossible to perform the low temperature control of the driving gas, the driving gas is discharged from the reserve tank 410, and is then supplied to the refiner 420 in a state of being heated by the cold heater 460, and is supplied to the heat exchanger 440 in a volume preset by the flow controller 480 after being regulated by the regulator 470 to a uniform pressure.

Referring to FIG. 4, when the high pressure converter 500 is composed of the expansion chamber 520, the expansion heater 520 and valves 530,540, the driving gas is discharged from the reserve tank 410, and is then introduced into the expansion chamber 510 via the inlet valve 540 which is opened by the negative pressure of the expansion chamber 510. As the expansion chamber 510 is heated by the expansion heater 520, the driving gas is increased to high pressure while expanding. Furthermore, the driving gas is discharged through the discharge valve 530 opened by the high pressure of the expansion chamber 510 and is then supplied to the refiner 420.

Referring to FIG. 6, the driving gas is preliminarily cooled by the cooling fluid 421 extending and supplied to a fluid extension line 610 while being supplied to the heat exchanger 440 by the flow controller 480, and is then supplied to the heat exchanger 440.

As set forth above, according to the cryoprobe using the closed gas loop for a nuclear magnetic resonance apparatus, since the rotor 200 in which the sample is put is rotated by the driving gas in a cooling state, thermal noise is reduced, thereby improving detection sensitivity. In particular, as the used driving gas is resupplied in a cooling state while being circulated by the gas loop 40, there is no need to recharge the driving gas, and accordingly, cost can be reduced, and environmental pollution due to discharge of the cooling gas can be also prevented.

Also, since the refiner 420 which constitutes the gas loop 400 removes the impurities such as water included in the driving gas, the driving gas is supplied to the rotor 200 in a pure state, thereby enabling the rotor 200 to be stably rotated.

Also, since the driving gas is regulated to room temperature and uniform pressure by the cold heater 460 and the regulator 470, when the low temperature control of the driving gas cannot be performed, it is possible to perform flow control by the flow controller 480.

Furthermore, since the expansion chamber 510 which constitutes the high pressure converter 500 discharges the driving gas in a state of being expanded by high pressure due to heating of the expansion heater 520, the driving gas can be pressurized with a reduction in noise and vibration.

In addition to this, when the high pressure converter 500 is configured in a plural number and thus is continuously installed, continuous high pressure conversion of the driving gas may be achieved, thereby leading to an improvement in the compression ratio of the driving.

Moreover, since the driving gas is preliminarily cooled by a preliminary heat exchanger 610 before the driving gas supplied to the heat exchanger 440, the driving gas can be easily and efficiently cooled in a cryogenic condition.

Specifically, since the fluid extension line 610 which constitutes the preliminary cooler 600 preliminarily cools the driving gas through the cooling fluid used in the refiner, a cooling effect of the driving gas can be maximized and an energy reduction effect resulting from reuse of the cooling fluid can be expected.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A cryoprobe using a closed gas loop for a nuclear magnetic resonance apparatus, comprising:
    superconducting magnets providing a magnetic field;
    a rotor rotatably disposed between the superconducting magnets in the state of a sample being put therein, the rotor being rotated by a driving gas;
    a coil configured to generate a nuclear magnetic resonance spectrum according to a resonance phenomenon of the sample by applying a radio frequency to the rotor; and
    a gas loop configured to cool the driving gas in a cryogenic condition while circulating it in a closed-loop condition and to supply the driving gas to the rotor,
    wherein the gas loop includes:
    a reserve tank connected to one side of the rotor and configured to introduce the driving gas which rotates the rotor and to absorb pressure while storing the driving gas;
    a refiner configured to refine impurities included in the driving gas by condensing the impurities while cooling the driving gas discharged from the reserve tank with a cooling fluid and allowing the driving gas to flow through the cooling fluid;
    a storage tank configured to store and discharge the driving gas refined in the refiner in a predetermined capacity;
    a heat exchanger configured to cool the driving gas to a cryogenic condition by performing heat-exchanging between the driving gas discharged from the reserve tank and a refrigerant and to supply the cooled driving gas to other side of the rotor; and
    a refrigerant cooler configured to cool the refrigerant that has been heat-exchanged with the driving gas while circulating the refrigerant to the heat exchanger.

2. The cryoprobe of claim 1, wherein the gas loop further comprises:
    a cold heater disposed at the front or rear of the reserve tank and configured to heat the driving gas at room temperature;
    a regulator connected to the cold heater via the refiner and the storage tank and configured to regulate pressure of the driving gas heated at the room temperature to a predetermined pressure; and
    a flow controller configured to provide the driving gas supplied from the regulator to the heat exchanger in a predetermined flow rate.

3. The cryoprobe of claim 1, wherein the gas loop further comprises at least one high pressure converter configured to convert the driving gas discharged from the reserve tank into high pressure and to supply it.

4. The cryoprobe of claim 3, wherein the high pressure converter comprises:
    an expansion chamber configured to provide an expansion space of the driving gas while storing the driving gas discharged the reserve tank;
    an expansion heater configured to expand the driving gas inside the expansion chamber by heating the expansion chamber and to convert the driving gas into high pressure;
    a discharge valve openably provided at an outlet of the expansion chamber to close the outlet and configured to discharge the driving gas of the high pressure while being opened by the driving gas of the expansion chamber being expanded at the high pressure; and
    an inlet valve openably provided at an inlet of the expansion chamber and for allowing the driving gas of the reserve tank to flow into the expansion chamber while being opened by the driving gas of the high pressure being discharged to the discharge valve.

5. The cryoprobe of claim 3, wherein the high pressure converter comprises:
    a high-pressure centrifugal converter configured to compress the driving gas at high pressure while providing a centrifugal force by rotating the driving gas discharged from the reserve tank.

6. The cryoprobe of claim 3, wherein the high pressure converter is configured in a plural number and is continuously installed in series or parallel, thereby continuously converting the driving gas into high pressure.

7. The cryoprobe of claim 1, wherein the gas loop further comprises:
    a preliminary heat exchanger configured to preliminarily cool the driving gas supplied to the heat exchanger by performing heat-exchanging between the driving gas and a cooling fluid of the refiner.

8. The cryoprobe of claim 7, wherein the preliminary heat exchanger comprises:
    a fluid extension line connected to the refiner so as to extend the cooling fluid used in the refiner and to allow the driving gas and the cooling fluid to flow in an adjacent state before the driving gas is supplied to the heat exchanger.

9. The cryoprobe of claim 1, wherein the driving gas comprises: at least one of nitrogen gas and helium gas.

* * * * *